United States Patent
Young

(10) Patent No.: US 10,530,340 B1
(45) Date of Patent: Jan. 7, 2020

(54) METHODS AND APPARATUS FOR A DYNAMIC ADDRESSING DECIMATION FILTER

(71) Applicant: SEMICONDUCTOR COMPONENTS INDUSTRIES, LLC, Phoenix, AZ (US)

(72) Inventor: Brian L. Young, Albany, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/232,530

(22) Filed: Dec. 26, 2018

(51) Int. Cl.
*H03H 17/06* (2006.01)
*H03M 3/00* (2006.01)
*H04N 5/363* (2011.01)
*H04N 5/378* (2011.01)
*H04N 5/3745* (2011.01)

(52) U.S. Cl.
CPC ........ *H03H 17/0664* (2013.01); *H03M 3/424* (2013.01); *H04N 5/363* (2013.01); *H04N 5/378* (2013.01); *H04N 5/37455* (2013.01)

(58) Field of Classification Search
CPC .... H04N 5/37455; H04N 5/378; H04N 5/363; H03M 3/424
USPC ................................................. 341/125–155
See application file for complete search history.

(56) References Cited

U.S. PATENT DOCUMENTS

| 5,103,229 | A | 4/1992 | Ribner | |
|---|---|---|---|---|
| 6,154,161 | A * | 11/2000 | Leme | H04H 60/04 341/143 |
| 7,221,918 | B1 * | 5/2007 | Grasbeck | H04B 1/30 375/148 |
| 9,015,219 | B2 * | 4/2015 | Bal | H03H 17/0664 708/316 |
| 9,241,153 | B2 * | 1/2016 | Hui | G06T 5/008 |
| 2003/0067404 | A1 * | 4/2003 | Ruha | H03M 3/392 341/143 |
| 2008/0035981 | A1 * | 2/2008 | Chang | H01L 27/115 257/315 |
| 2008/0183863 | A1 * | 7/2008 | Hess | G05B 13/024 709/224 |
| 2013/0006433 | A1 * | 1/2013 | Itagaki | H02H 7/26 700/292 |
| 2013/0335247 | A1 * | 12/2013 | Ceballos | H03M 3/344 341/143 |
| 2014/0167995 | A1 * | 6/2014 | Tiew | H03M 3/444 341/143 |

* cited by examiner

*Primary Examiner* — Lam T Mai
(74) *Attorney, Agent, or Firm* — The Noblitt Group, PLLC; Hettie L. Haines

(57) ABSTRACT

Various embodiments of the present technology may comprise a method, apparatus or system for dynamic addressing decimation filtering. In various embodiments, the apparatus comprises an analog modulator and a multi-bit dynamically addressing decimation filter. By pairing an analog modulator with the proper configuration with a multi-bit dynamically addressing decimation filter with the proper matching number of physical sub decimation filters, decimation filtering can be completed with a smaller number of physical sub decimation filters "N" than the quantizer level "M."

20 Claims, 10 Drawing Sheets

METHODS AND APPARATUS FOR A DYNAMIC ADDRESSING DECIMATION FILTER

BACKGROUND OF THE TECHNOLOGY

A sigma-delta analog-digital converter (ADC) oversamples a desired signal by a large factor and then filters the desired signal band with a decimation filter. Incremental analog-digital converters (IADCs) are a subclass of sigma-delta ADCs that are operated intermittently and exhibit high accuracy with low power dissipation. IADCs are frequently used in sensor and micro-electro-mechanical system (MEMS) interfaces.

IADCs are commonly implemented with single-bit quantizers, which limit the resolution and speed. When IADCs are implemented with multi-bit quantizers, the performance is largely improved by increasing the conversion rate and resolution of an ADC.

A decimation filter follows the IADC and reduces the sampling rate and filters off unwanted noise signal. Traditional decimation filters occupy a large area and consume a great amount of power. This is particularly true with IADCs implemented with multi-bit quantizers. When the quantizer level "M" increases, the decimation filter and post processing circuit's power demand and size increases.

Conventional methods for decimation filtering require a number of physical sub decimation filters "N" equal to the total number of quantizer levels "M." Therefore, it may be desired to create a power and area efficient decimation filter that allows the use of an optimized power efficient analog modulator, reduced chip thermal budget, and reduced chip area for lower cost.

SUMMARY OF THE INVENTION

Various embodiments of the present technology may comprise a method, apparatus or system for dynamic addressing decimation filtering. In various embodiments, the apparatus comprises an analog modulator and a multi-bit dynamically addressing decimation filter. By pairing an analog modulator with the proper configuration with a multi-bit dynamically addressing decimation filter with the proper matching number of physical sub decimation filters, decimation filtering can be completed with a smaller number of physical sub decimation filters "N" than a total number of quantizer levels "M."

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 10A:
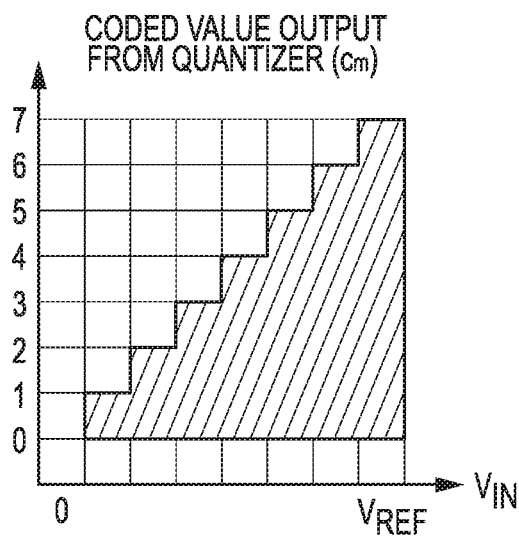
Figure 10B:
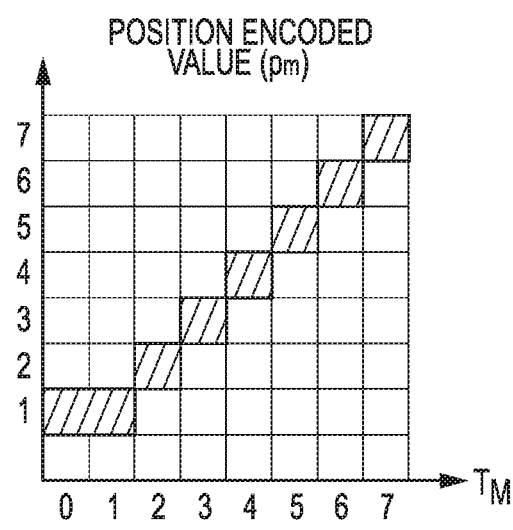
Figure 11:
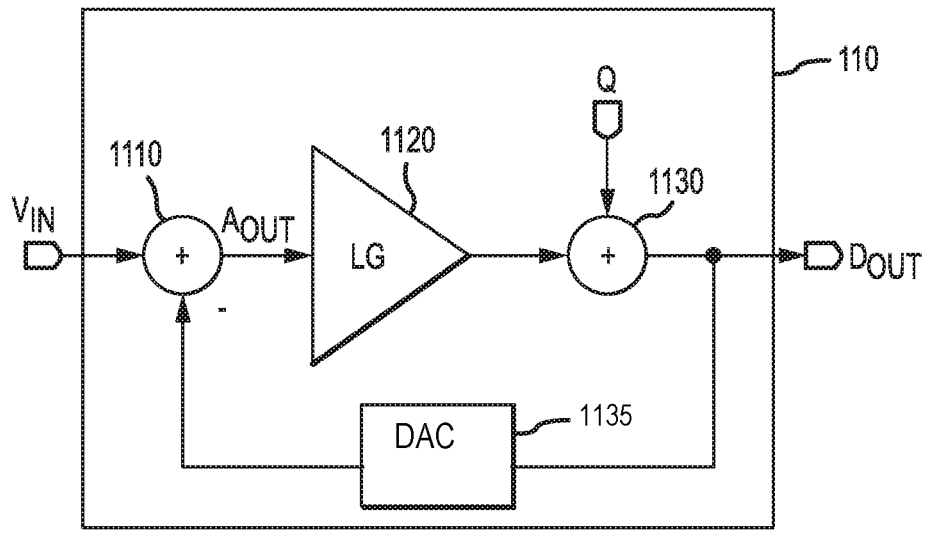
Figure 12:
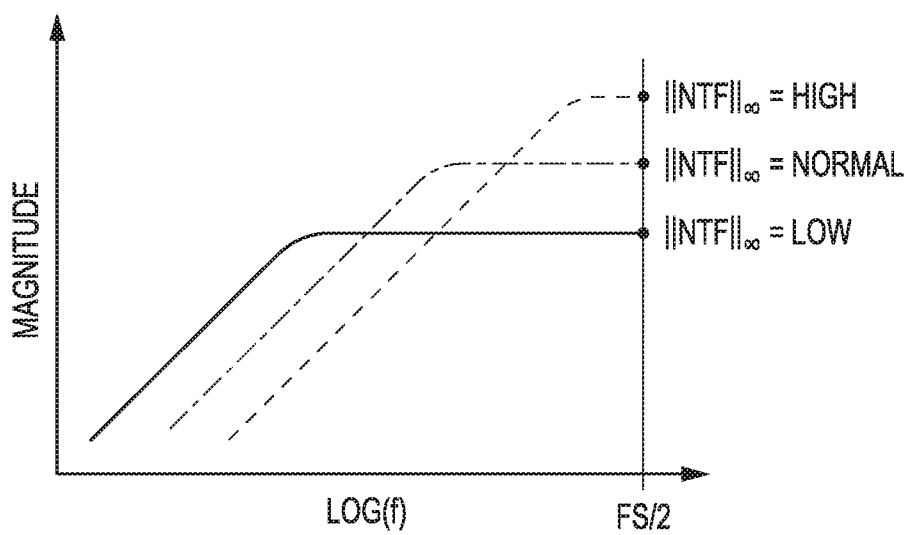
Figure 13:
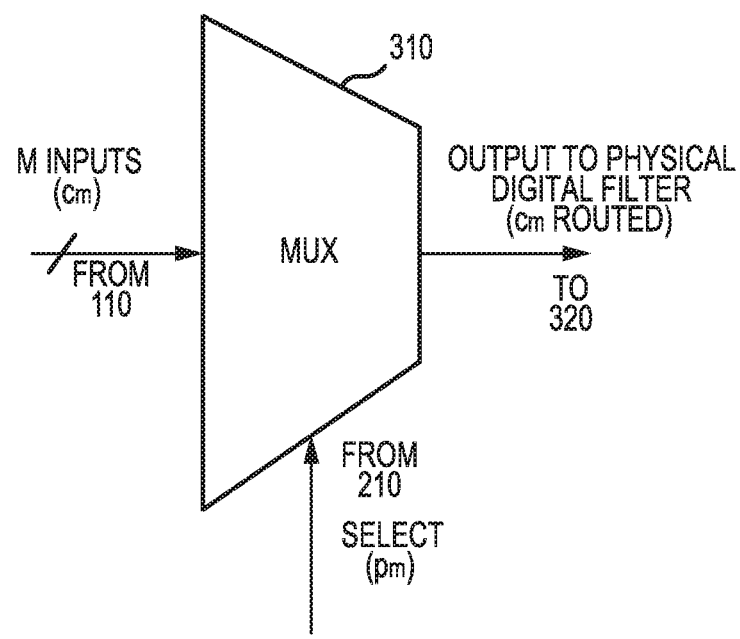
Figure 14:
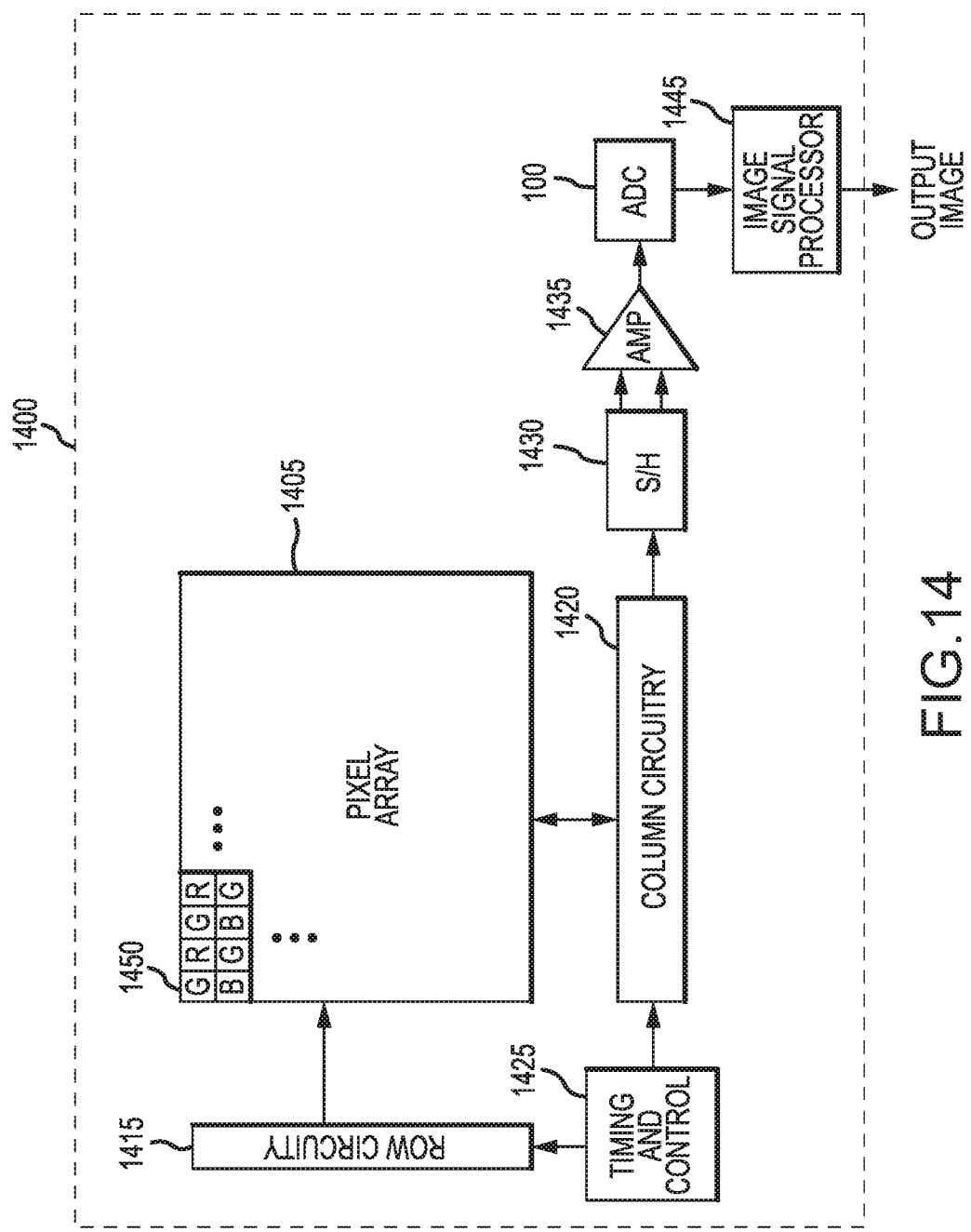

FIGS. 10A-B are a pair of graphs illustrating a position encoded value as it relates to a coded value output from a quantizer in accordance with an exemplary embodiment of the present technology;

FIG. 11 is a block diagram of an analog modulator in accordance with an exemplary embodiment of the present technology;

FIG. 12 is a graph of various NTF magnitudes as a function of a logarithm of the frequency in accordance with an exemplary embodiment of the present technology;

FIG. 13 is a block diagram of a multiplexer in accordance with an exemplary embodiment of the present technology; and FIG. 14 is a block diagram of an imaging system in accordance with an exemplary embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various processors, multiplexers, controllers, accumulators, and the like, which may carry out a variety of functions. In addition, the present technology may be practiced in conjunction with any number of systems such as imaging, automotive, aerospace, medical, scientific, surveillance, and consumer electronics, and the systems described are merely exemplary applications for the technology.

Figure 1:
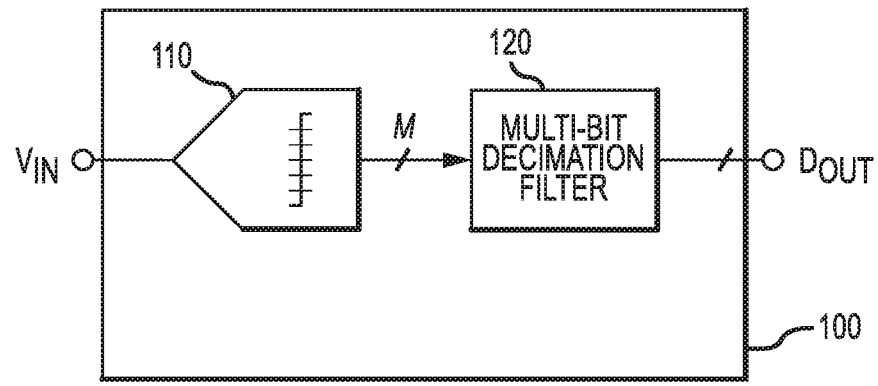
FIG. 1 is a block diagram of an electronic system in accordance with an exemplary embodiment of the present technology.
Figure 2:
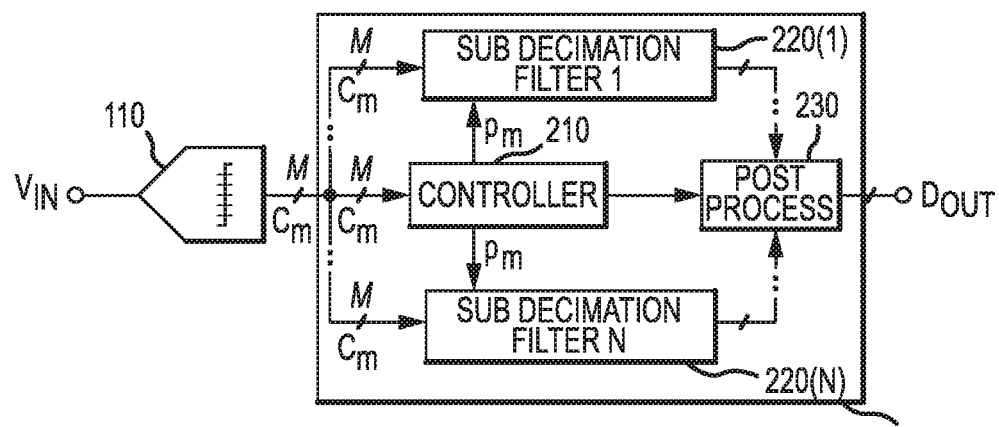
FIG. 2 is a block diagram of a multi-bit decimation filter in accordance with an exemplary embodiment of the present technology.

Methods and apparatus for dynamic addressed decimation filtering according to various aspects of the present technology may operate in conjunction with any suitable electronic system and/or device, such as "smart devices," wearables, consumer electronics, portable devices, vehicles, recording devices, broadcasting devices, photo sensing devices, MEMS interfaces, communication devices, and the like. Referring to FIGS. 1 and 2, an exemplary incremental analog-digital converter (IADC) 100 may be incorporated into any suitable electronic device, such as an imaging system 1400 (FIG. 14).

According to various embodiments, the IADC 100 may be configured to convert an analog signal into a digital signal for various applications such as converting audio, video, thermal, or telecommunication signals. The IADC 100 may receive an input voltage $V_{IN}$ and convert the input voltage $V_{IN}$ to a digital output signal $D_{OUT}$. For example, in various embodiments, the IADC 100 may comprise an analog modulator with M-level quantizer 110 and a multi-bit dynamic addressing decimation filter 120. According to an exemplary embodiment, the decimation filter 120 may comprise a controller 210, a plurality of sub decimation filters 220, where a total number of sub decimation filters "N" is less than a total number of quantizer levels "M," and a post processing circuit 230 that operate together to provide power and area efficient decimation filtering.

An exemplary incremental analog-digital converter (IADC) 100 may comprise the analog modulator with M-level quantizer 110 and the multi-bit dynamic addressing decimation filter 120. The analog modulator 110 may generate and output from the quantizer a digital signal $c_m$ comprising a coded value and transmit the coded value $c_m$ to the multi-bit dynamic addressing decimation filter 120.

Proper decimation filter operation with a reduced size and power demand occurs by limiting the number of quantizer bits that toggle by using proper circuit architecture and design and utilizing dynamic addressing in a multi-bit decimation filter. The magnitude plot of the high pass shaped quantization noise transfer function (NTF) determines this proper circuit architecture.

Referring to FIG. 12, the NTF magnitude plot indicates which quantization noise (Q) frequencies are suppressed or amplified. High frequency quantization noise is of most concern. The infinity norm represents the highest quantization noise gain, which usually occurs at Fs/2. It is the infinity norm for high frequency quantization noise that determines the upper limit of N, which is the minimum N that will work for this invention for a given analog modulator, which guides the configuration of the multi-level quantizer. Proper circuit architecture and design can keep the loop gain (LG) well controlled across process, voltage, and temperature variations, ensuring a controlled number of toggling quantizer levels and proper decimation filter operation.

The decimation filter 120 is configured to receive the coded value $c_m$ at an input terminal. The decimation filter 120 may operate to attenuate out-of-band quantization noise and unwanted out-of-band signals present in the modulator's analog input.

According to an exemplary embodiment, and referring to FIG. 11, the linearized analog modulator with M-level quantizer 110 may be configured to receive the input voltage $V_{IN}$, quantize the input voltage $V_{IN}$, and generate a quantized output signal $D_{OUT}$.

According to an exemplary embodiment, the analog modulator with M-level quantizer 110 may comprise an adder circuit 1110 that outputs to an amplifier 1120 that outputs to a quantizer 1130. The linearized analog modulator with M-level quantizer 110 receives the input voltage $V_{IN}$ at a first input terminal of the adder circuit 1110. The input voltage $V_{IN}$ may vary slowly, nearly DC. The linearized analog modulator with M-level quantizer 110 receives a quantization noise Q at an input terminal of the quantizer 1130. The linearized analog modulator with M-level quantizer 110 generates the quantized output signal $D_{OUT}$. The quantized output signal $D_{OUT}$ may comprise a digital signal. The analog modulator with M-level quantizer 110 transmits the quantized output signal $D_{OUT}$ to a digital-to-analog converter (DAC) 1135, wherein the quantized output signal $D_{OUT}$ is converted back to an analog signal and then transmitted to a second input terminal of the adder circuit 1110. The quantized output signal $D_{OUT}$ is also transmitted to an input terminal of the controller 210 (FIG. 2). The quantized output signal $D_{OUT}$ may comprise the M coded value $c_m$ with a maximum of N toggling levels.

The adder circuit 1110 is configured to compute a difference value. For example, the adder circuit 1110 may be configured to compute a difference value $A_{OUT}$ between the input voltage $V_{IN}$ and the quantized output signal $D_{OUT}$, (i.e., $A_{OUT}=V_{IN}-D_{OUT}$) and transmit the difference value $A_{OUT}$ to the amplifier 1120. According to an exemplary embodiment, the adder circuit 1110 may comprise two input terminals and an output terminal. One of the two input terminals may be configured to receive the input voltage $V_{IN}$ and the remaining input terminal may receive the quantized output signal $D_{OUT}$ from the quantizer 1130.

The amplifier 1120 is configured to apply a gain to an input signal. For example, the amplifier may apply a gain to the difference value $A_{OUT}$. According to an exemplary embodiment, the amplifier 1120 comprises an input terminal and an output terminal. The amplifier 1120 may receive the difference value $A_{OUT}$ at the input terminal and generate an analog output signal according to a loop gain (LG). In general, the loop gain is kept low because the number of toggling quantizer levels is proportional to the loop gain. The amplifier 1120 may comprise any circuit and/or system suitable for maintaining control of a loop gain across process, voltage, and temperature variations, to ensure a controlled number of toggling quantizer levels and proper decimation filter operation.

The quantizer 1130 quantizes the analog signal input from the amplifier 1120 into a digital signal. The difference between the analog signal input from the amplifier 1120 and its quantized value is a quantization error, which is modeled by the quantization noise Q. The quantizer 1130 feeds back the digital signal output (i.e., the quantized output signal $D_{OUT}$) to the adder circuit 1110 and further transmits the digital signal output to the controller 210.

The linearized analog modulator with M-level quantizer 110 may be described according to a noise transfer function (NTF), which indicates which quantization noise frequencies are suppressed or amplified according to a NTF magnitude. For example, the noise transfer function may be calculated with the following equation:

$$NTF = \frac{V_{out}}{Q} = \frac{1}{1+LG},$$

where $V_{OUT}$ is the output voltage that corresponds to the quantized output signal $D_{OUT}$, Q is the quantization noise, and LG is the loop gain.

According to an exemplary embodiment, and referring to FIG. 2, the multi-bit decimation filter 120 may comprise the controller 210, the plurality of sub decimation filters 220, where the total number of sub decimation filters N is less than the total quantizer level M, and the post processing circuit 230. The multi-bit decimation filter 120 may be configured to attenuate out-of-band quantization noise and unwanted out-of-band signals present in the modulator's analog input.

According to an exemplary embodiment, the controller 210 transmits a series of signals to each sub decimation filter 220 to dynamically address each sub decimation filter 220 individually. This dynamic addressing reduces the overall decimation filter size and power demands. The controller 210 generates a position encoded value $p_m$ according to the M coded value $c_m$ from the M-level quantizer 110. The controller 210 may further transmit a series of signals, such as the position encoded values $p_m$ and the coded values $c_m$, to the post processing circuit 230.

Figure 3:
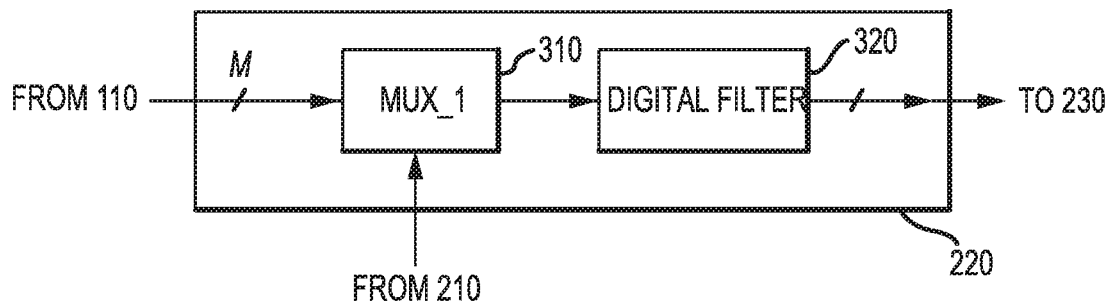
FIG. 3 is a block diagram of a sub decimation filter in accordance with an exemplary embodiment of the present technology.
Figure 4:
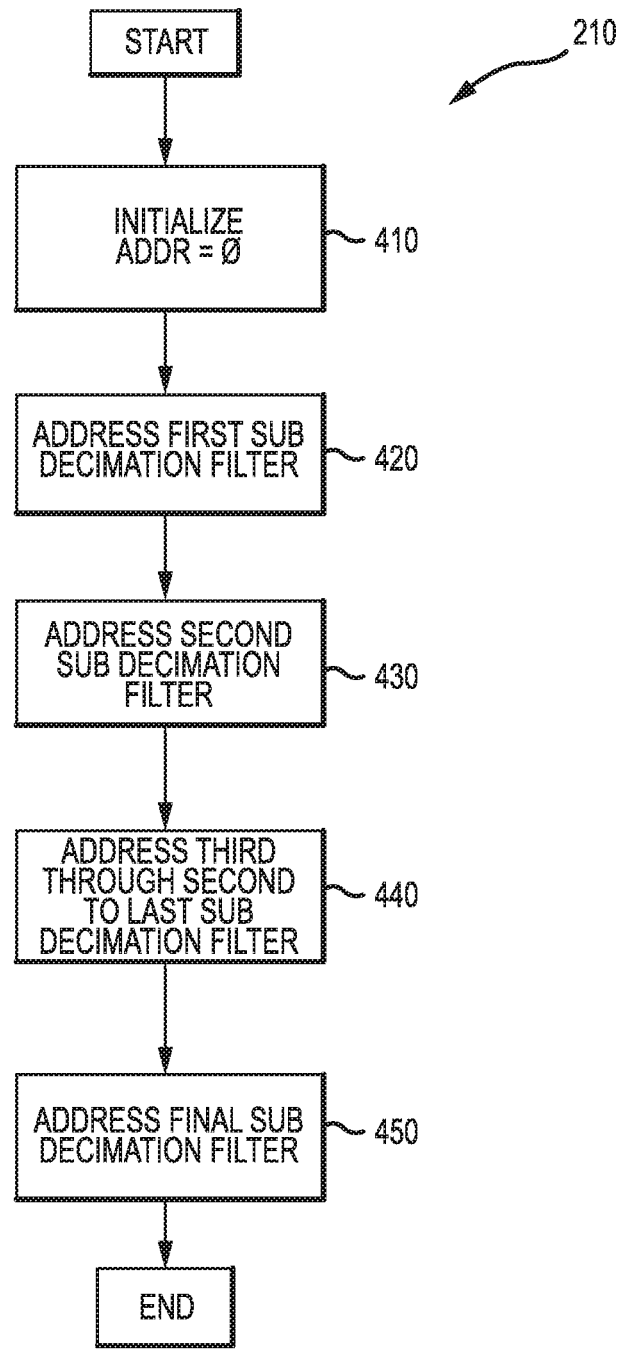
FIG. 4 is a flow chart for operating a controller in accordance with an exemplary embodiment of the present technology.

Referring to FIG. 3, each sub decimation filter 220 operates as an individual decimation filter. The total number of sub decimation filters 220 is N, which is equal to a maximum number of toggling levels as controlled by the configuration of the analog modulator 110. The number N is less than the total number of quantizer levels M. Each sub decimation filter 220 is connected to the analog modulator 110. For example, each sub decimation filter 220 comprises an input terminal connected to the output terminal of the analog modulator 110. Each sub decimation filter receives a position encoded input $p_m$ from an output terminal of the controller 210, wherein the positions encoded input $p_m$ is used to dynamically address the respective sub decimation filter 220. Each sub decimation filter 220 is further connected to the post processing circuit 230. For example, an output terminal of each sub decimation filter 220 is connected to an input terminal of the post processing circuit 230. Each sub decimation filter 220 may comprise any circuit and/or device suitable for decimation filtering. For example, each sub decimation filter 220 may comprise a multiplexer 310 and a digital filter 320.

The post processing circuit 230 performs desired post-process transformations on various signals. For example, the post processing circuit 230 may be configured to correct, sum, or scale. In an exemplary embodiment, the post processing circuit 230 may comprise a weighted coefficient generator and be configured to correct, sum, scale, sum with a weighted coefficient, or scale with a weighted coefficient. According to an exemplary embodiment, the post processing circuit 230 comprises N+1 inputs, where one input is connected to the output terminal of the controller 210 and each remaining input is connected to an output terminal of one of the plurality of sub decimation filters 220.

Referring to FIG. 13, the multiplexer 310 selectively transmits bit from the coded value $c_m$. According to an exemplary embodiment, the multiplexer 310 comprises two input terminals and one output terminal. One of the two input terminals receives the coded value $c_m$ from the output terminal of the linearized analog modulator with M-level quantizer 110. The remaining input terminal is a select input and receives a select signal $p_m$ from the output terminal of the controller 210. The select signal $p_m$ selectively transmits bits from the coded value $c_m$ from the analog modulator 110 to the digital filter 320.

The digital filter 320 is configured to store and accumulate data. For example, the digital filter 320 may receive a bit from the coded value $c_m$ from the controller 210 or routed through the multiplexer 310. The digital filter 320 may store the bits and data and transmit an accumulated bit value to the post process circuit 230. The digital filter 320 may comprise any number of circuits and/or systems suitable for storing and accumulating data. For example, the digital filter 320 may comprise an accumulator (not shown) and a multiplexer (not shown) that operate together to perform the desired storing and accumulation functions.

Referring to FIGS. 4-8, in operation, the IADC 100 dynamically addresses the physical sub decimation filters to execute incremental analog to digital conversion.

According to an exemplary operation, the controller 210 may begin with an initialization phase 410, and continues into a first phase 420, then a second phase 430, then a third phase 440, then a fourth phase 450. According to an exemplary operation, the controller 210 initializes each sub decimation filter 220 and the post processing circuit 230. The controller 210 sets the ADDR value equal to an empty set.

The first phase 420 addresses a first sub decimation filter. The second phase 430 addresses a second sub decimation filter. The third phase 440 repeats the second phase 430 a number of times until all sub decimation filters except for one are addressed. The fourth phase 450 addresses a remaining sub decimation filter that has not yet been addressed and checks to make sure that all sub decimation filters have been properly addressed. These phases are described in further detail below.

The controller 210 has a cycle that starts with the initialization phase 410 and continues through four more phases to address the sub decimation filters. After all of the necessary sub decimation filters 220 are addressed, the incremental analog-digital converter 100 processes the rest of the data from the sample. When a new sample is collected, this addressing cycle goes back to the initialization phase 410. This initialization phase initializes all of the sub decimation filters 220, and sets ADDR=0.

Figure 5:
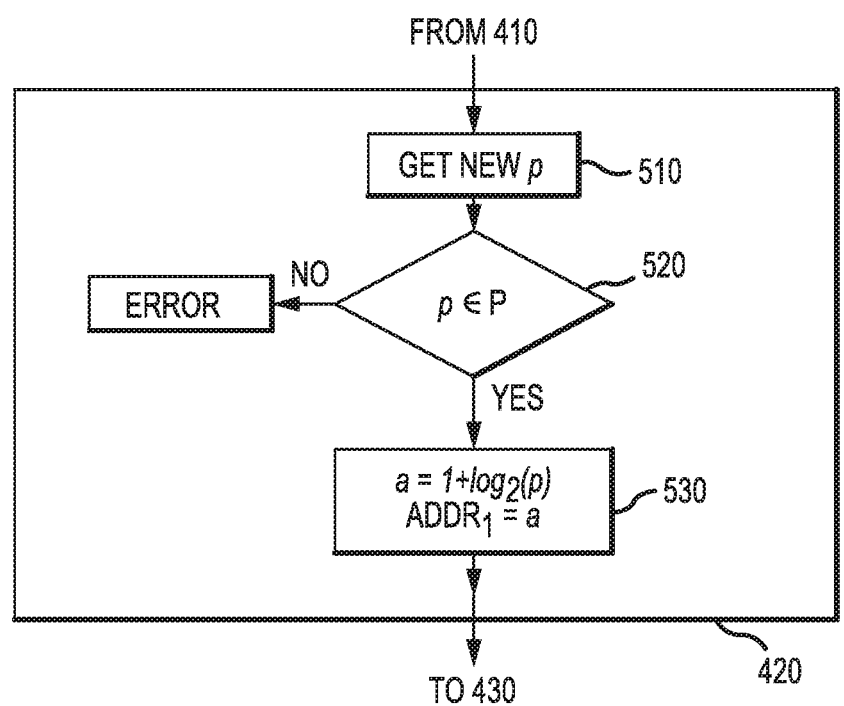
FIG. 5 is a flow chart for operating a first phase of the controller in accordance with an exemplary embodiment of the present technology.

Referring to FIG. 5, the first phase 420 addresses a first sub decimation filter 220(1) from the plurality of sub decimation filters. The first phase 420 does not have to determine if the address value has already been used or if it is a next address because it is the first addressing in a cycle. For example, the first phase may get a new value for "p", check the validity of the new "p" value, set a new value for a candidate address value "a" as a function of the new p value and then address the new "a" value. For example, a first step 510 of the first phase 420 is to fetch a new current position value "p".

A second step 520 of the first phase 420 is to check that the fetched current position value "p" is within the set of valid position values P. If it is not within that set, an error signal is produced. If it is within that set, the cycle proceeds to the third step 530 of the first phase 420.

A third step 530 of the first phase 420 is to set the current value of "a" to $a=1+\log_2(p)$. Then, the first address is set to the current value of "a" so that $ADDR_1=a$.

Figure 6:
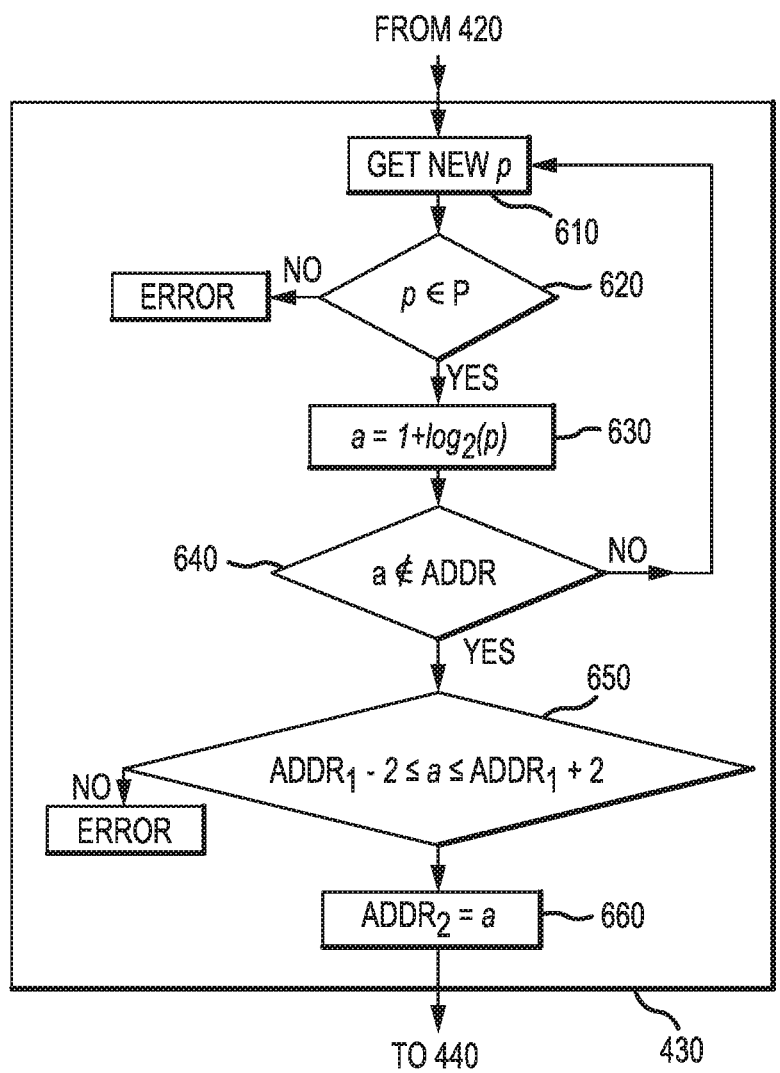
FIG. 6 is a flow chart for operating a second phase of the controller in accordance with an exemplary embodiment of the present technology.

Referring to FIG. 6, the second phase 430 addresses a second sub decimation filter 220 from the plurality of sub decimation filters. It is not the first address, so the second phase 460 determines if the new address value has already been used and determines for it to be a consecutive address of the first address. For example, the second phase may get a new value for "p", check the validity of the new "p" value, set a new value for "a" as a function of the new "p" value, check that the new value for "a" hasn't already been addressed, check the validity of the new "a" value, and then address the new "a" value. For example, a first step 610 of the second phase 430 is to fetch a new current position value "p".

A second step 620 of the second phase 430 is to check that the fetched current position value "p" is within the set of valid position values P. If it is not within that set, an error signal is produced. If it is within that set, the cycle proceeds to the third step 630 of the second phase 430.

A third step 630 of the second phase 430 is to set the current value of "a" to $a=1+\log_2(p)$.

A fourth step 640 of the second phase 430 is to check that the current value of "a" is not within the current set of addresses ADDR. If it is within that set, then a sub decimation filter 220 has already been addressed for that value of "a" and the next step is to return to the first step 610 of the second phase 430. If it is not within that set, then that value of "a" has not been addressed yet and the next step is the fifth step 650 of the second phase 430.

A fifth step 650 of the second phase 430 is to check that the current "a" value is consecutive. This is done by checking ADDR$_1$−(N−1)≤a≤ADDR$_1$+(N−1). In the present example, N=3. If it is not, then an error signal is produced. If it is, then the next step is the sixth step 660 of the second phase 430.

A sixth step 660 of the second phase 430 is to set the next address value to "a" so that ADDR$_2$=a.

Figure 7:
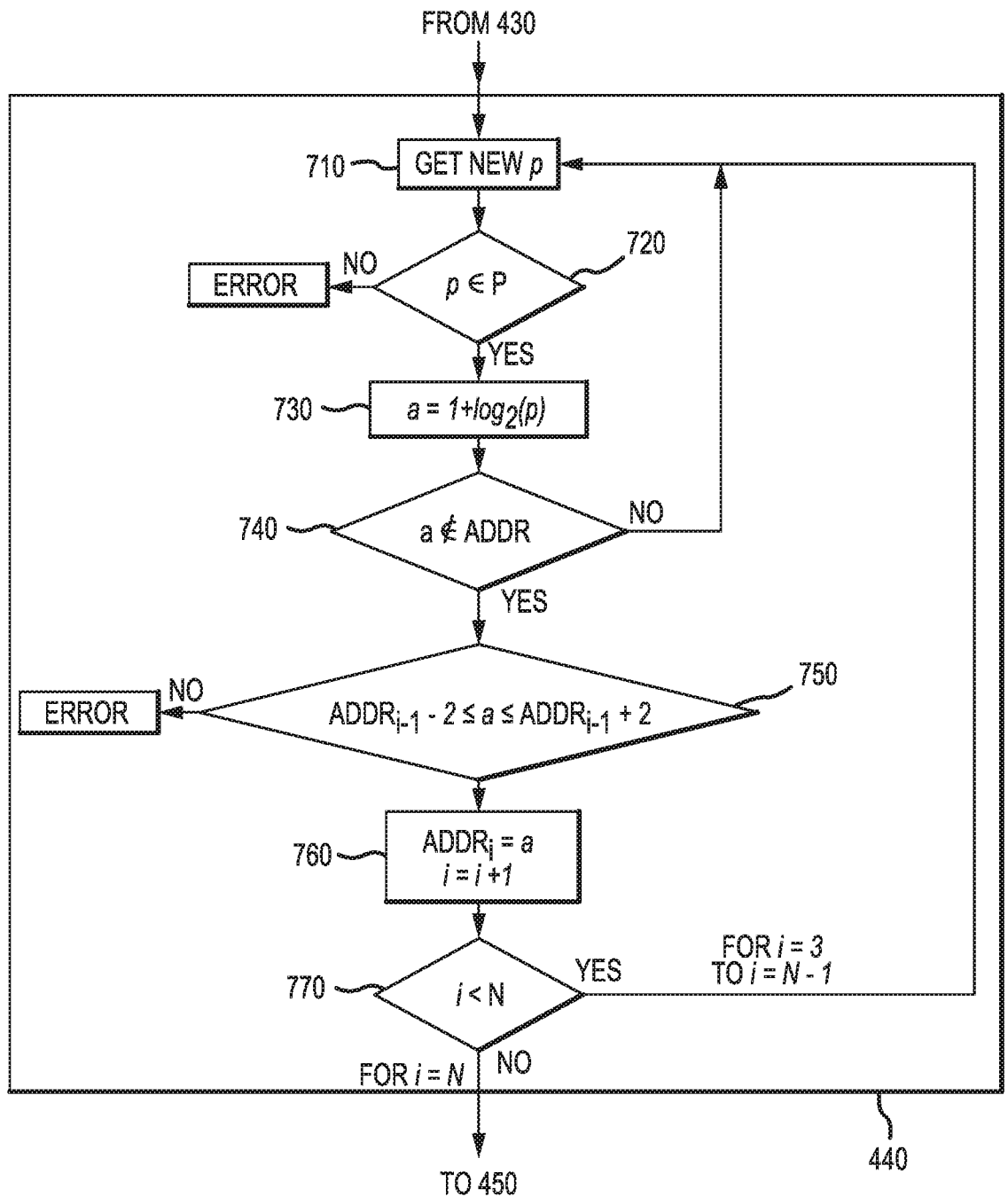
FIG. 7 is a flow chart for operating a third phase of the controller in accordance with an exemplary embodiment of the present technology.

Referring to FIG. 7, the third phase 440 addresses the sub decimation filters 220(2:N−1). It is the same series of signals as the second phase 430. During the third phase 440, the controller 210 operates by looping the addressing to address the remaining sub decimation filters 220(2:N−1). For example, the third phase may get a new value for "p", check the validity of the new "p" value, set a new value for "a" as a function of the new "p" value, check that the new value for "a" hasn't already been addressed, check the validity of the new "a" value, address the new "a" value, and loop until only one address remains. For example, a first step 710 of the third phase 440 is to fetch a new current position value "p".

A second step 720 of the third phase 440 is to check that the fetched current position value "p" is within the set of valid position values P. If it is not within that set, an error signal is produced. If it is within that set, the cycle proceeds to the third step 730 of the third phase 440.

A third step 730 of the third phase 440 is to set the current value of "a" to a=1+log$_2$(p).

A fourth step 740 of the third phase 440 is to check that the current value of "a" is not within the current set of addresses ADDR. If it is within that set, then a sub decimation filter 220 has already been addressed for that value of "a" and the next step is to return to the first step 710 of the third phase 440. If it is not within that set, then that value of "a" has not been addressed yet and the next step is the fifth step 750 of the third phase 440.

A fifth step 750 of the third phase 440 is to check that the current "a" value is consecutive. This is done by checking ADDR$_{i-1}$−(N−1)≤a≤ADDR$_{i-1}$+(N−1), where "i−1" is the previous addressed value and N=3. If it is not, then an error signal is produced. If it is, then the next step is the sixth step 760 of the third phase 440.

A sixth step 760 of the third phase 440 is to set the next address value to "a" so that ADDR$_i$=a, where "i" is the next address position after "i−1." In this exemplary embodiment, this value "i" is then incremented so i=i+1 for the purpose of detecting whether or not this is the final address.

For all values of "i" from i=3 to i=N−1, the next step is to return to the first step 710 of the third phase 440. By repeating this loop all the remaining sub decimation filters will be addressed except for the final one. When i=N, there is only one sub decimation filter left to address and the next step is the first step 810 of the fourth phase 450.

Figure 8:
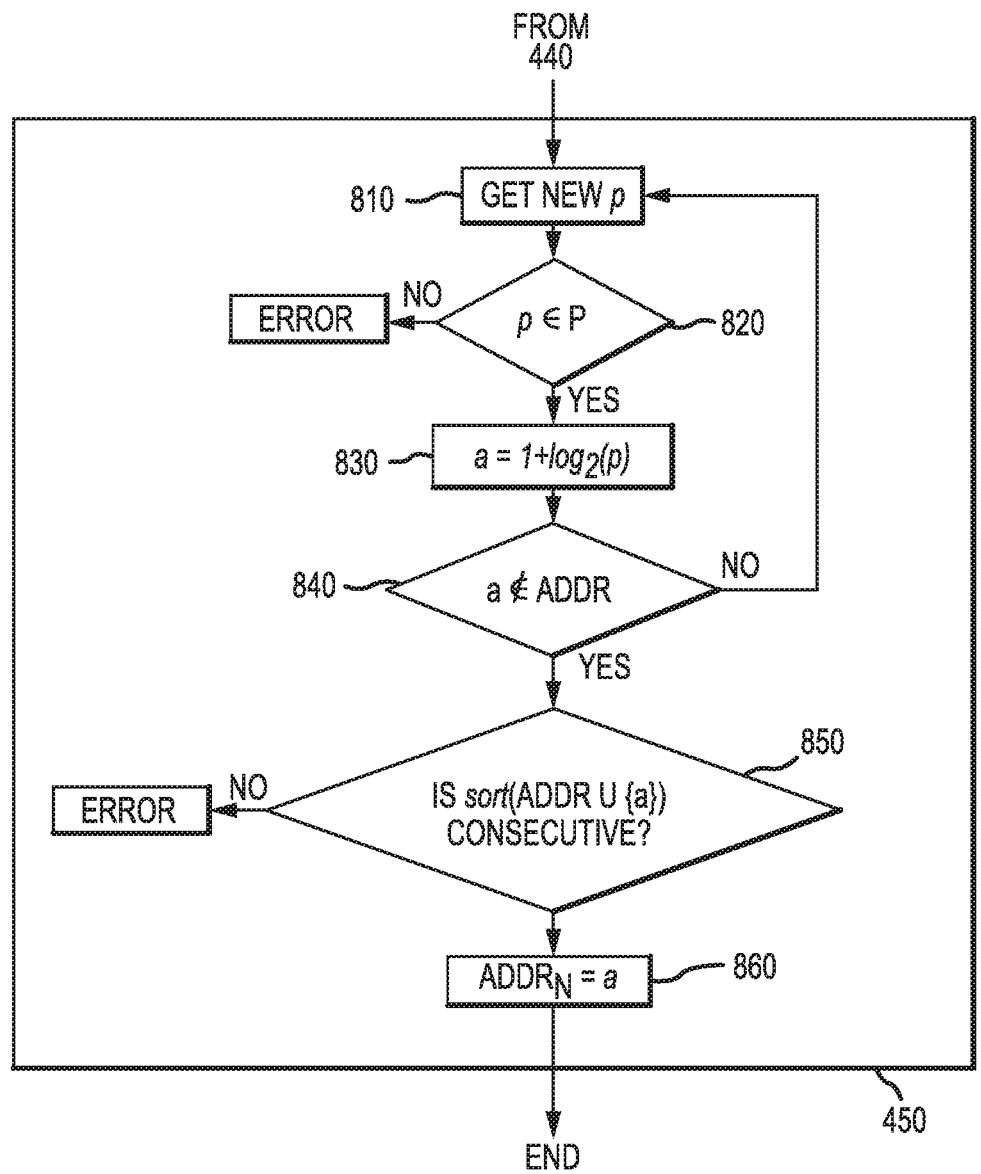
FIG. 8 is a flow chart for operating a fourth phase of the controller in accordance with an exemplary embodiment of the present technology.
Figure 9:
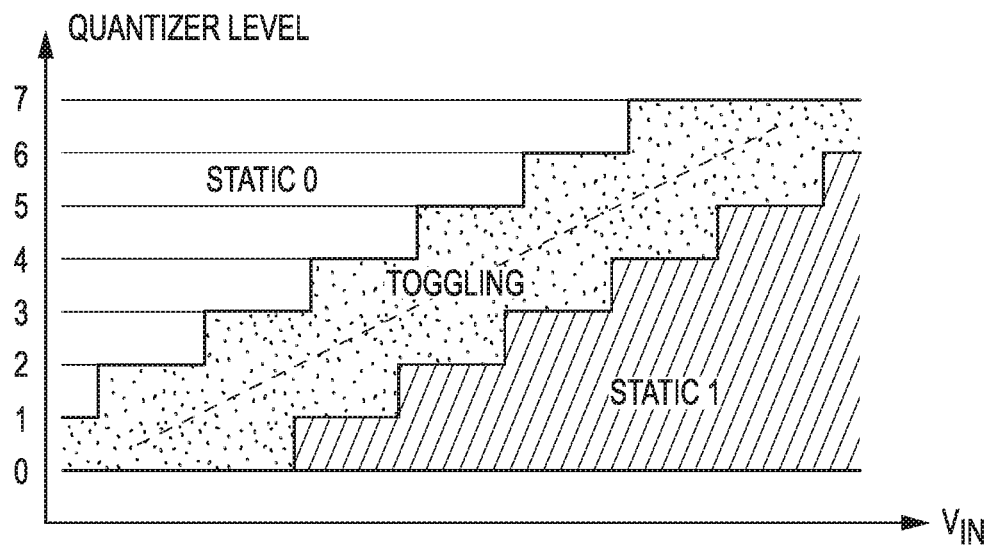
FIG. 9 is a graph illustrating quantizer levels versus input voltages in accordance with an exemplary embodiment of the present technology.

Referring to FIG. 8, the fourth phase 450 addresses a final remaining sub decimation filter 220(N) in a cycle. It is the same series of signals as the second phase 430 and the third phase 440, but it also includes a final error checking step before making the final address. For example, the fourth phase may get a new value for "p", check the validity of the new "p" value, set a new value for "a" as a function of the new "p" value, check that the new value for "a" hasn't already been addressed, check the validity of the new "a" value, check the validity of the address values, and then address the new "a" value. For example, a first step 810 of the fourth phase 450 is to fetch a new current position value "p".

A second step 820 of the fourth phase 450 is to check that the fetched current position value "p" is within the set of valid position values P. If it is not within that set, an error signal is produced. If it is within that set, the cycle proceeds to the third step 830 of the fourth phase 450.

A third step 830 of the fourth phase 450 is to set the current value of "a" to a=1+log$_2$(p).

A fourth step 840 of the fourth phase 450 is to check that the current value of "a" is not within the current set of addresses ADDR. If it is within that set, then a sub decimation filter 220 has already been addressed for that value of "a" and the next step is to return to the first step 810 of the fourth phase 450. If it is not within that set, then that value of "a" has not been addressed yet and the next step is the fifth step 850 of the fourth phase 450.

A fifth step 850 of the fourth phase 450 is a final error check. At this step, the controller checks to see if sort (ADDR∪{a}) is consecutive. This is to check that all the sub decimation filters that have been addressed were addressed correctly. If this check yields a no, then an error signal is produced. If this check yields a yes, then the next step is the final step in this cycle, the sixth step 860 of the fourth phase 450.

A sixth step 860 of the fourth phase 450 is to set the next address value to "a" so that ADDR$_N$=a. After this step, a number of sub decimation filters equal to the maximum number of toggling levels from the linearized analog modulator with M-level quantizer 110 have been addressed.

The levels that are not toggling are either static 0 or static 1, and are handled by the controller 210 as though by virtual sub decimation filters. There are M-N virtual sub decimation filters, which consume zero power and area. Processing the static levels by the controller 210 so that M-N physical sub decimation filters do not need to be implemented is how this dynamically addressing decimation filter has reduced the area and power demands.

The position encoded value p$_m$ is used to dynamically address the physical sub decimation filters 220 as described in the controller 210 phases above. The position encoded value p$_m$ is also used to determine the number of virtual sub decimation filters to count. The number of static 1 virtual sub decimation filters is equal to min(p$_m$)−1. The static 0 virtual sub decimation filters can be ignored. The total value of virtual sub decimation filters is calculated as $$\frac{\min(p_m)-1}{L!}\prod_{i=0}^{L-1} OSR+i,$$

where L is the modulating order and OSR is the oversampling ratio.

The incremental analog-digital converter 100 may be utilized in a variety of applications. In an exemplary embodiment, the incremental analog-digital converter 100 can be used within an imaging device 1400. The imaging device 1400 (also referred to as an "image sensor") captures and generates image data. The imaging device 1400 may be combined with a processor, such as a CPU, a digital signal processor, or a microprocessor, in a single integrated circuit, or may be on a separate chip. In the present embodiment, the imaging device 1400 may comprise a CMOS imager or any other suitable imaging architecture.

The imaging device 1400 may capture and generate image data corresponding to one or more rows in the pixel array 1405. The image data may comprise image pixel data corresponding to one or more pixels 1450 in the pixel array 1405. Once a scene, or part of a scene, is captured by the imaging device 1400, the resulting capture may be represented as an image capture. Each image capture may comprise image pixels which correspond to the pixels in the pixel array 1405.

In various embodiments, the imaging device 1400 may further comprise row circuitry 1415, column circuitry 1420, and a timing and control unit 1425, for selectively activating sequential rows of pixels to be read out to a sample-and-hold circuitry 1430. The pixel signal may be then be transmitted to an amplifier 1435 to amplify the signal prior to being converted to a digital signal by the incremental analog-digital converter 100. The digital pixel data may then be transmitted to and stored in the image signal processor 1445 for further processing.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

While the technology has been described with reference to specific exemplary embodiments, various modifications and changes may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus for incremental analog-digital conversion, comprising:
an analog modulator comprising:
a multi-level quantizer, configured to control a total number of toggling quantizer levels; and
a multi-bit dynamically addressing decimation filter, comprising:
a controller;
a set of physical sub decimation filters, where a total number of physical sub decimation filters is less than the total number of toggling quantizer levels; and
a post processing circuit.

2. The apparatus of claim 1, wherein the analog modulator further comprises:
an analog input coupled from an external device; and
an output coupled to an input of the controller and the set of physical sub decimation filters.

3. The apparatus of claim 1, wherein the controller is further configured to:
receive a coded value output from the multi-level quantizer at a controller input;
generate a position encoded value;
output a position encoded value to a select input of the set of physical sub decimation filters;
manage a plurality of virtual sub decimation filters; and
check for errors.

4. The apparatus of claim 1, wherein each physical sub decimation filter is further configured to:
receive a coded value output from the multi-level quantizer at a first sub decimation filter input;
receive a position encoded value output from the controller at a second sub decimation filter input; and
route the coded value output from the multi-level quantizer to the post processing circuit.

5. The apparatus of claim 1, wherein the post processing circuit is further configured to:
receive data from the set of physical sub decimation filters;
correct, sum, or scale the data from at least one of the set of physical sub decimation filters and a plurality of virtual sub decimation filters; and
generate a digital output according to the received data.

6. The apparatus of claim 1, wherein each physical sub decimation filter further comprises a multiplexer and a digital filter.

7. The apparatus of claim 1, wherein the post processing circuit further comprises a weighted coefficient generator.

8. The apparatus of claim 1, wherein an output terminal of the multi-level quantizer is connected to a first input terminal of each physical sub decimation filter from the set of physical sub decimation filters.

9. The apparatus of claim 1, wherein an output terminal of the controller is connected to:
a second input terminal of each physical sub decimation filter from the set of physical sub decimation filters; and
an input terminal of the post processing circuit.

10. The apparatus of claim 1, wherein the post processing circuit is connected to an output terminal of each physical sub decimation filter from the set of physical sub decimation filters.

11. A method for incremental analog-digital conversion, comprising:
   analog modulating comprising controlling a number of toggling quantizer levels; and
   dynamically addressing a multi-bit decimation filter, comprising:
      receiving a quantizer coded value;
      generating a position encoded value according to the received quantizer coded value;
      addressing a set of physical sub decimation filters according to the generated position encoded value;
      routing the quantizer coded value according to the addressed set of physical sub decimation filters;
      managing a number of virtual sub decimation filters according to the quantizer coded value;
      filtering the quantizer coded value; and
      generating a digital output according to the filtered quantizer coded value.

12. The method of claim 11, wherein dynamically addressing the multi-bit decimation filter further comprises checking for errors.

13. The method of claim 11, wherein dynamically addressing the multi-bit decimation filter further comprises performing at least one of: correcting, summing, and scaling values received from the set of physical sub decimation filters and a controller.

14. The method of claim 11, wherein dynamically addressing the multi-bit decimation filter further comprises generating a weighted coefficient.

15. The method of claim 14, wherein dynamically addressing the multi-bit decimation filter further comprises performing at least one of: correcting, summing, and scaling values received from the set of physical sub decimation filters with the weighted coefficient.

16. A system, comprising:
   a sensor; and
   an incremental analog-to-digital converter (ADC) connected to the sensor and configured to:
      receive an analog input signal from the sensor; and
      generate a digital output signal according to the analog input signal, comprising:
         converting the analog input signal to a quantizer value from a total number of quantizer values;
         generating a position encoded value based on the quantizer value; and
         addressing a plurality of sub decimation filters using the position encoded value, wherein a number of the plurality of sub decimation filters is less than the total number of quantizer values.

17. The system of claim 16, wherein the ADC comprises:
   a multi-level quantizer configured to convert the analog input signal to the quantizer value; and
   a multi-bit dynamically addressing decimation filter, comprising:
      a controller responsive to the multi-level quantizer; and
      the plurality of sub decimation filters; wherein each sub decimation filter is responsive to the controller and the multi-level quantizer.

18. The system of claim 17, wherein each sub decimation filter from the plurality of sub decimation filters comprises a multiplexer and a digital filter.

19. The system of claim 17, wherein the controller is further configured to:
   receive the quantizer value from the multi-level quantizer;
   generate the position encoded value; and
   transmit the position encoded value to the plurality of sub decimation filters.

20. The system of claim 16, wherein the ADC is further configured to apply a weighted coefficient to the digital output signal.

\* \* \* \* \*